(12) United States Patent
Yang

(10) Patent No.: US 11,177,303 B2
(45) Date of Patent: Nov. 16, 2021

(54) IMAGE SENSOR AND SEMICONDUCTOR STRUCTURE

(71) Applicant: SHENZHEN GOODIX TECHNOLOGY CO., LTD., Guangdong (CN)

(72) Inventor: Meng-Ta Yang, Taipei (TW)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 196 days.

(21) Appl. No.: 16/420,931

(22) Filed: May 23, 2019

(65) Prior Publication Data

US 2020/0098814 A1    Mar. 26, 2020

Related U.S. Application Data

(60) Provisional application No. 62/734,461, filed on Sep. 21, 2018.

(51) Int. Cl.
*H01L 27/146* (2006.01)

(52) U.S. Cl.
CPC .. *H01L 27/14625* (2013.01); *H01L 27/14645* (2013.01)

(58) Field of Classification Search
CPC ........... H01L 27/14625; H01L 27/1464; H01L 27/14643
USPC ...................................................... 257/436
See application file for complete search history.

(56) References Cited

U.S. PATENT DOCUMENTS

| 8,148,762 B2* | 4/2012 | Joe .................... H01L 31/02165 257/294 |
| 8,409,904 B2* | 4/2013 | Adkisson .......... H01L 27/14632 438/65 |
| 8,759,932 B2* | 6/2014 | Gravrand ............ H01L 31/1032 257/436 |
| 2009/0146198 A1 | 6/2009 | Joe et al. |

(Continued)

FOREIGN PATENT DOCUMENTS

| CN | 106463518 A | 2/2017 |
| CN | 107154414 A | 9/2017 |
| CN | 107749415 A | 3/2018 |

(Continued)

OTHER PUBLICATIONS

English Abstract Translation of Foreign Reference CN 106463518 A.

(Continued)

*Primary Examiner* — Mark V Prenty
(74) *Attorney, Agent, or Firm* — WPAT P.C., Intellectual Property Attorneys; Anthony King

(57) ABSTRACT

Present disclosure provides a pixel for receiving an incident light, the pixel including a semiconductor substrate, a photo diode in the semiconductor substrate, and a metasurface structure over the semiconductor substrate. The metasurface structure has a first side and a second side opposite to the first side, the first side of the metasurface structure facing the semiconductor substrate, the second side of the metasurface structure facing the incident light. The metasurface structure includes a plurality of trenches at the second side, wherein the plurality of trenches have a same profile from a cross-sectional view.

15 Claims, 16 Drawing Sheets

(56) References Cited

U.S. PATENT DOCUMENTS

2009/0154871 A1    6/2009   Pyo et al.
2009/0323060 A1*  12/2009   Knipp ........................ G01J 3/12
                                                                356/327

FOREIGN PATENT DOCUMENTS

| CN | 108122935 A | 6/2018 |
| CN | 108183112 A | 6/2018 |
| DE | 102014113618 A1 | 10/2015 |
| EP | 2428993 A2 | 3/2012 |

OTHER PUBLICATIONS

English Abstract Translation of Foreign Reference CN 107154414 A.
English Abstract Translation of Foreign Reference CN 107749415 A.
English Abstract Translation of Foreign Reference CN 108122935 A.
English Abstract Translation of Foreign Reference CN 108183112 A.
English Abstract of DE102014113618A1.

* cited by examiner

IMAGE SENSOR AND SEMICONDUCTOR STRUCTURE

CROSS REFERENCE TO RELATED APPLICATIONS

This application claims the benefit of U.S. provisional application 62/734,461, filed on Sep. 21, 2018, which is incorporated by reference in its entirety.

TECHNICAL FIELD

The present disclosure relates to an image sensor and, more particularly, to an image sensor with metasurface structure.

BACKGROUND

Many modern day electronic devices comprise optical imaging devices (e.g., digital cameras) that use image sensors. An image sensor may include an array of pixel sensors and supporting logic. The pixel sensors measure incident radiation (e.g., light), and the supporting logic facilitates readout of the measurements. One type of image sensor commonly used in optical imaging devices is a back-side illumination (BSI) image sensor. BSI image sensor fabrication can be integrated into conventional semiconductor processes for low cost, small size, and high through-put. Further, BSI image sensors have low operating voltage, low power consumption, high quantum efficiency, low read-out noise, and allow random access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1AA is a cross-sectional view of an image sensor with an array of pixels, according to some embodiments of the present disclosure.

DETAILED DESCRIPTION

Figure 1A:
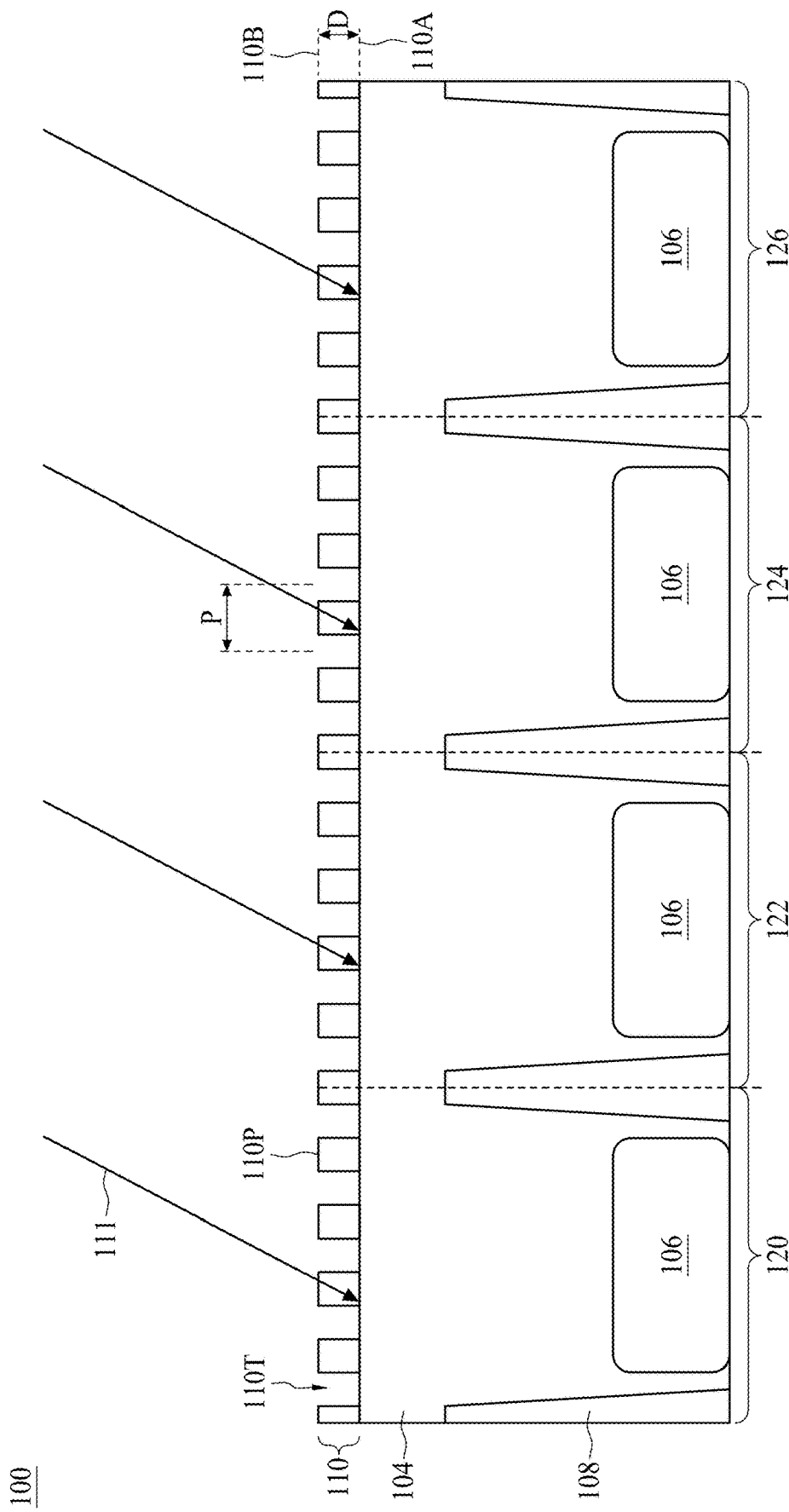
FIG. 1A is a cross-sectional view of an image sensor with an array of pixels, according to some embodiments of the present disclosure.
Figure 1A:
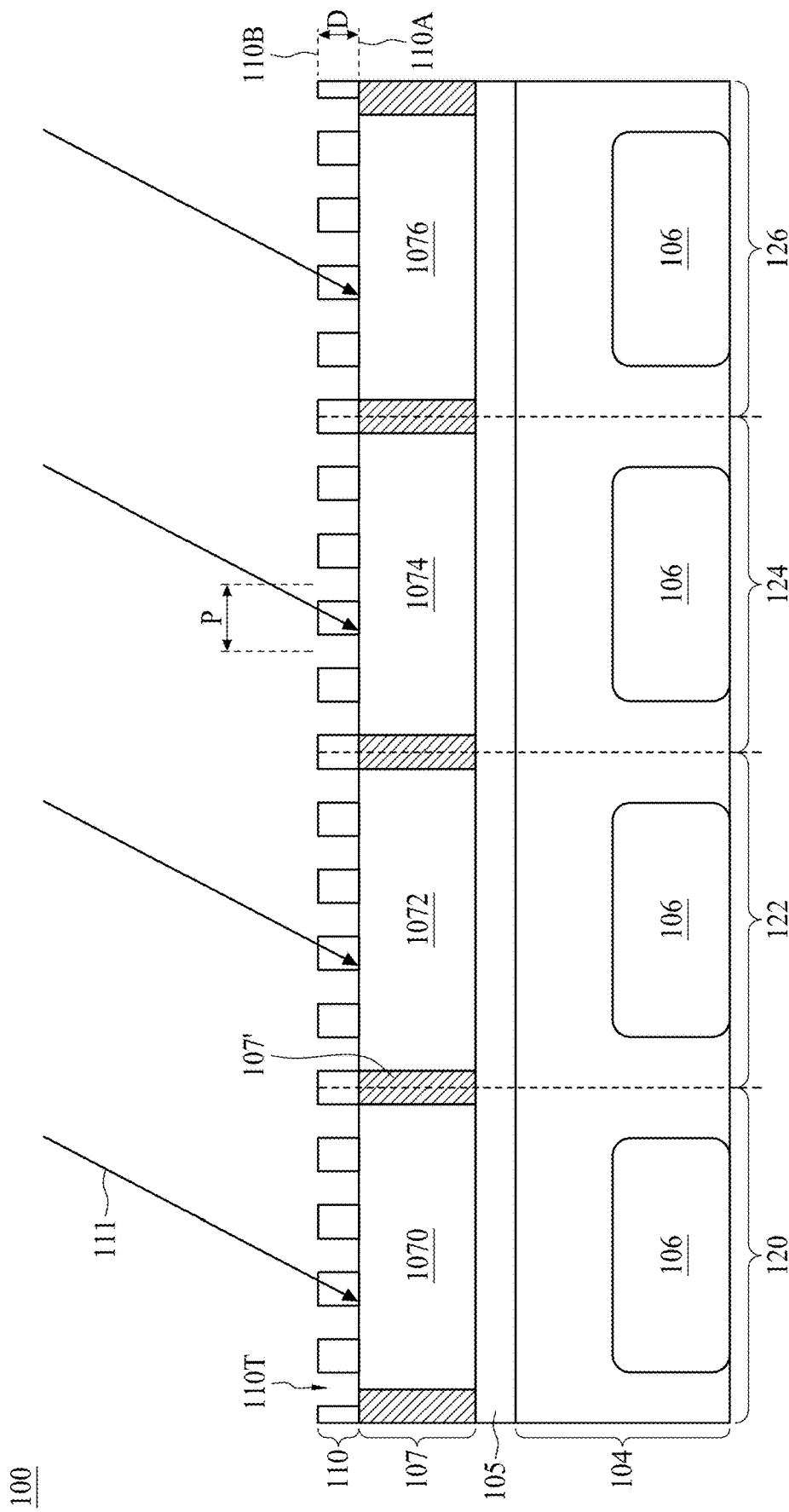

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Conventional image sensor can only record light intensity based on opto-electric conversion. Due to the limitation of sensing mechanism of conventional image sensor, the direction information of the incident radiation cannot be recorded. In order to obtain light field information (i.e., including light intensity and direction information), plenoptic camera has been developed. However, the plenoptic camera suffered from low resolution because one microlens is paired with a great number of micro pixel array. It is the location of the micro pixel that provides direction information of the incident radiation. Other approaches such as having radiation passing through offset apertures prior to arriving at the light sensing region have been proposed. The result is non-satisfactory because a portion of the light is blocked by the offset aperture prior to being detected. Present disclosure provides an image sensing structure, or an image sensor, having a metasurface structure which can render satisfactory resolution and sufficient signal strength.

Referring to FIG. 1A, a cross-sectional view of some embodiments of an image sensor 100 with an array of pixels 120, 122, 124, 126, is provided according to some embodiments of the present disclosure. In some embodiments, the image sensor 100 can be a back side image sensor (BSI) in which a back side of the semiconductor substrate 104 is receiving the incident radiation 111 while a photodiode region 106 is formed in proximity to a front side, as opposed to the back side, of the semiconductor substrate 104. The pixels 120, 122, 124, 126 are sensitive to an incident radiation 111 impinging on the receiving surface, or the back side, of the image sensor 100. The pixels 120, 122, 124, 126 are separated by back side deep trench isolation 108 to prevent cross talk between adjacent pixels. As shown in FIG. 1, a metasurface structure 110 is positioned at the back side of the substrate 104, configured to interact with the incident radiation 111 prior to the detection of such incident radiation 111 at the photodiode region 106. The metasurface structure 110 may be a structure capable of inducing light-matter interaction between the incident radiation 111 and itself.

Photodiode regions 106 corresponding to the pixels 120, 122, 124, 126 are arranged within a semiconductor substrate 104. The photodiode regions 106 are configured to measure the intensity of incident radiation 111 on sensing surfaces of the photodiode regions 106 and, in some embodiments, to facilitate readout of the measurements. In some embodiments, the metasurface structure 110 having a particular pattern is designed to enhance local optical field so as to improve the quantum efficiency of the image sensor 100.

Figure 1C:
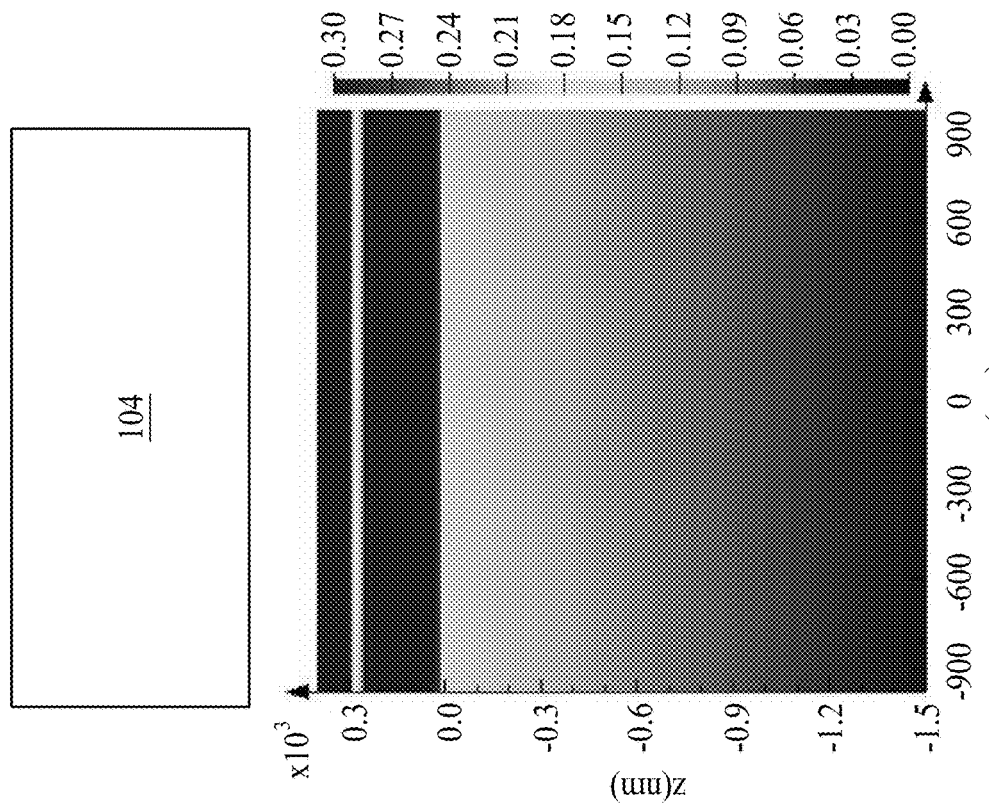
FIG. 1C is a semiconductor substrate and the corresponding simulation result of light field distribution in the semiconductor substrate, according to a comparative embodiment of the present disclosure.
Figure 1B:
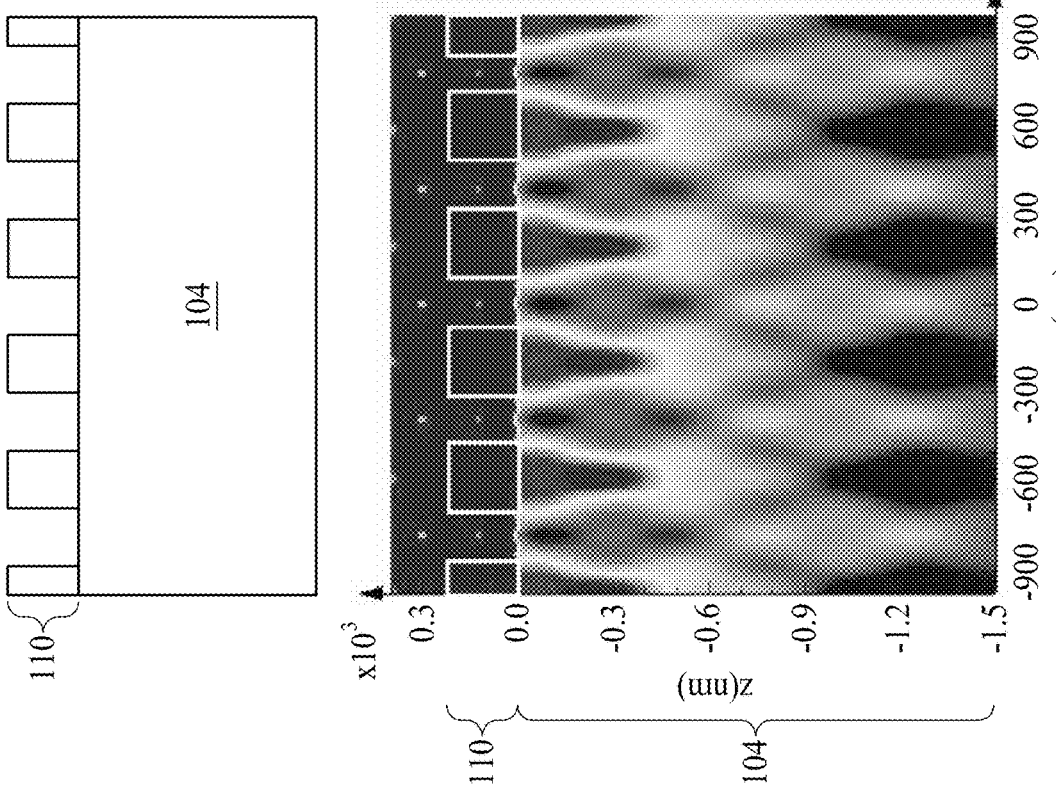
FIG. 1B is a metasurface structure over a semiconductor substrate and the corresponding simulation result of light field distribution in the semiconductor substrate, according to some embodiments of the present disclosure.

Referring to FIG. 1B of a current embodiment and FIG. 1C of a comparative embodiment, the light field of the incident radiation in the substrate 104 may be altered by passing through the metasurface structure 110. The lower portion of FIG. 1C shows a simulation result of light field distribution in a semiconductor substrate 104 without the presence of metasurface structure, whereas the upper portion of FIG. 1C is the corresponding physical structure of the substrate under radiation. The intensity of the light field is gray scale coded and normalized from 0.00 to 0.30 (see gray scale bar on the right of FIG. 1C). When no metasurface structure present at the upper surface of the substrate 104, the light field intensity appears uniform along a horizontal direction and gradually decreasing toward the bottom surface of the substrate 104. The lower portion of FIG. 1B shows a simulation result of light field distribution in a semiconductor substrate 104 with the presence of metasurface structure 110, whereas the upper portion of FIG. 1B is the corresponding physical structure of the substrate 104 and the metasurface structure 110 under radiation. The intensity of the light field is gray scale coded and normalized from 0.00 to 0.30 (see gray scale bar on the right of FIG. 1B). When metasurface structure 110 is present at the upper surface of the substrate 104, the light field intensity appears to be enhanced in particular locations (e.g., under the protruding pattern of the metasurface structure 110) and reduced in other locations (e.g., under the trench pattern of the metasurface structure 110). The non-uniform light field pattern is carried toward the bottom surface of the substrate 104.

As shown in FIG. 1A, the metasurface structure 110 include a first side 110A and a second side 110B opposite to the first side 110A. For example, the first side 110A may be facing, or in contact with, the semiconductor substrate 104. The second side 110B may be facing the incident direction of the radiation 111. In some embodiments, the metasurface structure 110 includes a periodic pattern having alternating protrusions 110P and trenches 110T on the substrate 104 from a cross-sectional perspective. As shown in FIG. 1A, the trenches 110T has a tetragonal shape from a cross-sectional perspective and a linear arrangement (see FIG. 3) or a circular arrangement (see FIG. 4) from a top perspective. Two adjacent trenches 110T define a pitch P of the metasurface structure 110. A depth D between a top and a bottom of the trench 110T can be measured. In some embodiments, the pitch P and/or a depth D of the metasurface structure 110 is smaller than a wavelength of the incident radiation 111, in order to avoid light diffraction. As a result, the metasurface structure 110 may include a nanostructure configured for light-matter interaction with the incident radiation 111. If the incident radiation 111 includes a range of wavelengths on the spectrum, the metasurface structure 110 may have a pitch P and/or a depth D smaller than the shortest wavelength of the range.

In some embodiments, the metasurface structure 110 may be a portion of the semiconductor substrate 104 formed by photolithography operations. In such embodiment, the metasurface structure 110 may be composed of materials identical to that of the substrate 104. Alternatively, the metasurface structure 110 may be formed on a top surface of the semiconductor substrate 104 by a spin-on coating operation followed by a patterning operation. In such embodiment, the metasurface structure 110 may be composed of polymeric materials having desired refractive indices. Alternatively, the metasurface structure 110 may be formed on a top surface of the semiconductor substrate 104 by a deposition operation or an annealing operation followed by a patterning operation. In such embodiment, the metasurface structure 110 may be composed of oxides or nitrides materials having desired refractive indices.

As demonstrated in FIG. 1B and FIG. 1C, the presence of the metasurface structure 110 effectively changes the light field in the semiconductor substrate 104. When the metasurface structure 110 is formed over an image sensor 100 of FIG. 1A, in which the photodiode region 106 is devised to overlap with the enhanced light field intensity region caused by the metasurface structure 110, the quantum efficiency of the image sensor 100 can be enhanced.

In some embodiments, the metasurface structure 110 of FIG. 1A may further inhibit the propagation, or greatly reduce the intensity, of radiation 111 of certain wavelengths into the semiconductor substrate 104, and inherently serving the purpose of a color filter layer with respect to each pixel.

Referring back to FIG. 1AA, in some embodiments, a grid structure 107 can be arranged over the semiconductor substrate 104 and under the metasurface structure 110. The grid structure 107 is separated from the semiconductor substrate 104 by one or more dielectric layers 105. Further, the grid structure 107 may include a metal grid structure 107' blocking incident radiation or a dielectric grid structure (not shown) arranged over the metal grid structure 107'. Color filters 1070, 1072, 1074, 1076, corresponding to the pixels 120, 122, 124, 126, respectively, are arranged within the grid structure 120, and configured to filter radiation in route to the photodiode regions 106.

Figure 2:
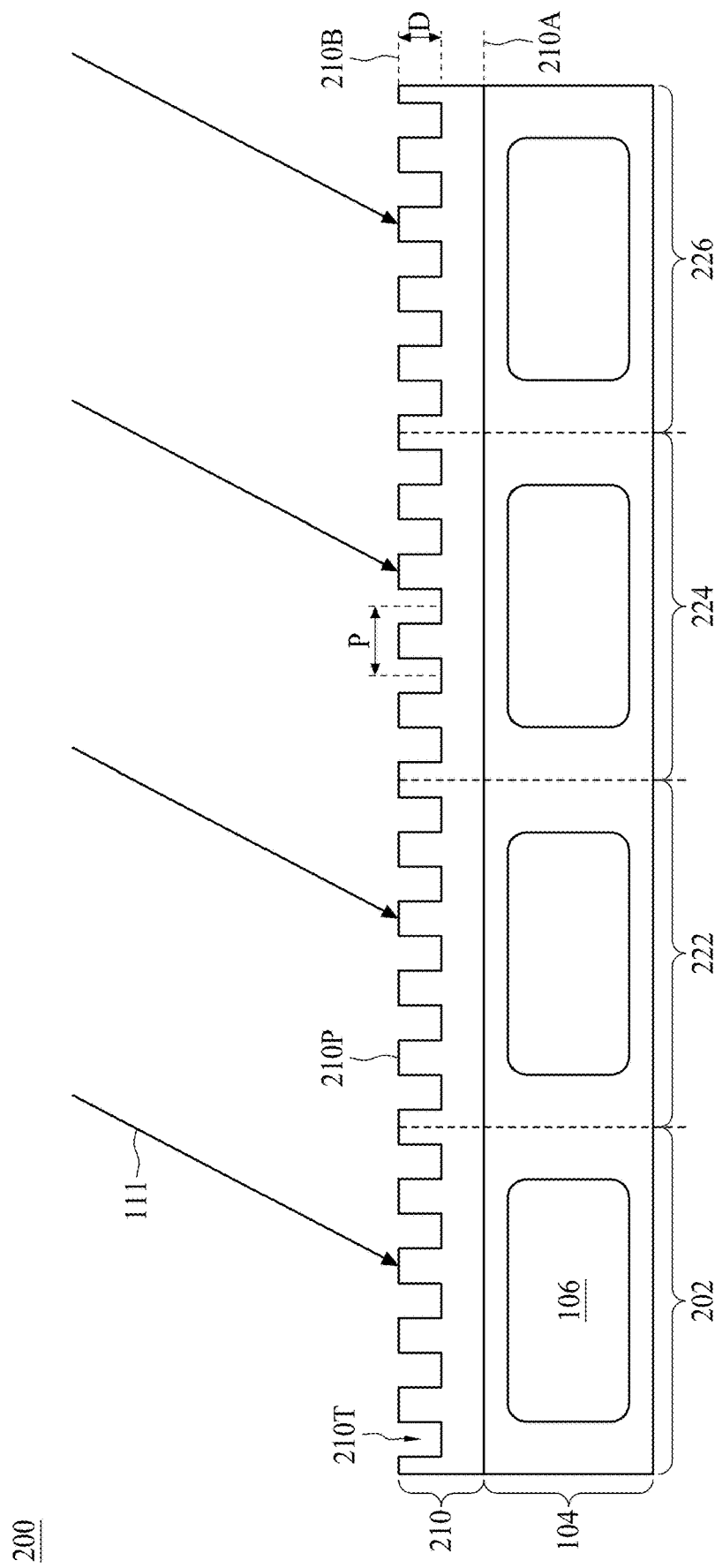
FIG. 2 is a cross-sectional view of an image sensor with an array of pixels, according to some embodiments of the present disclosure.

Referring to FIG. 2, a cross-sectional view of an image sensor 200 with an array of pixels 220, 222, 224, 226, is provided according to some embodiments of present disclosure. The metasurface structure 210 includes a first side 210A and a second side 210B opposite to the first side 210A. For example, the first side 210A may be facing, or in contact with, the semiconductor substrate 104. The second side 210B may be facing the incident direction of the radiation 111. In some embodiments, the metasurface structure 210 includes a periodic pattern having alternating protrusions 210P and trenches 210T on the substrate 104 from a cross-sectional perspective. As shown in FIG. 2, the trenches 210T have a tetragonal shape from a cross-sectional perspective and a linear arrangement (see FIG. 3) or a circular arrangement (see FIG. 4) from a top perspective. Two adjacent trenches 210T define a pitch P of the metasurface structure 210. A depth D between a top and a bottom of the trench 210T can be measured. Image sensor 200 in FIG. 2 is different from the image sensor 100 in FIG. 1 in that the trench depth D of the metasurface structure 210 is less than the entire thickness of the metasurface structure 21, that is, a distance between the first side 210A and the second side 210B.

In some embodiments, the pitch P and/or a depth D of the metasurface structure 210 is smaller than a wavelength of the incident radiation 111, in order to avoid light diffraction. As a result, the metasurface structure 210 may include a nanostructure configured for light-matter interaction with the incident radiation 111. If the incident radiation 111 includes a range of wavelengths on the spectrum, the metasurface structure 210 may have a pitch P and/or a depth D smaller than the shortest wavelength of the range.

In some embodiments, the metasurface structure 210 may be formed on a top surface of the semiconductor substrate 104 by a spin-on coating operation followed by a patterning operation, for example, nanoimprint operation. In such embodiment, the metasurface structure 210 may be composed of polymeric materials having desired refractive indices. Alternatively, the metasurface structure 110 may be formed on a top surface of the semiconductor substrate 104 by a dielectric deposition operation or an annealing operation, followed by a patterning operation, for example, a time-mode dry etching operation. In some embodiments, an etch stop layer (not shown) may be deposited at a suitable level of the dielectric layer to facilitate the patterning of the trenches 210T with desired depth D. In such embodiment, the metasurface structure 210 may be composed of oxides or nitrides materials having desired refractive indices. As shown in FIG. 2, the pitch P of the metasurface structure 210 can be identical in all pixels 220, 222, 224, 226.

Figure 3:
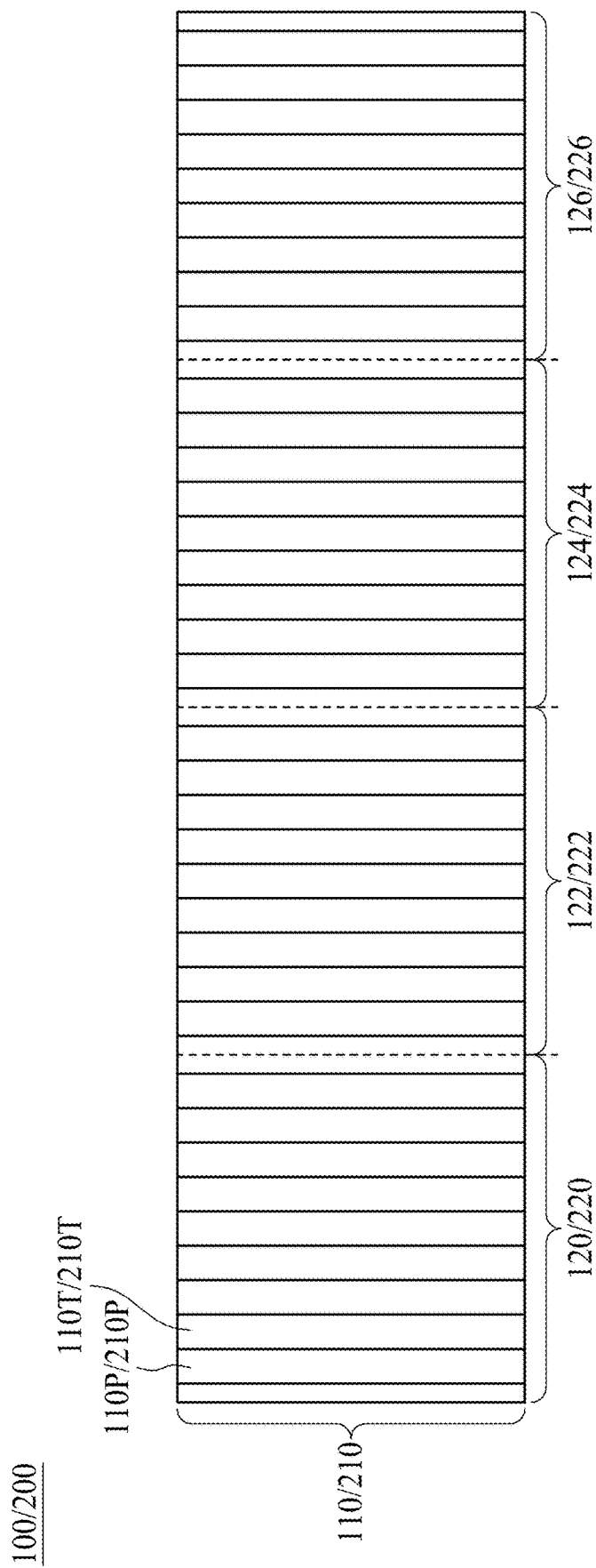
FIG. 3 is a top view of an image sensor with an array of pixels, according to some embodiments of the present disclosure.

Referring to FIG. 3, a top view of image sensors 100 and 200 with an array of pixels 120/220, 122/222, 124/224, 126/226, is provided according to some embodiments of present disclosure. As previously discussed in FIG. 1A, FIG. 1AA, and FIG. 2, the top view of the metasurface structures 110, 210 can be arranged in a linear fashion as shown in FIG. 3. The trenches 110T and protrusions 110P of image sensor 100 extend along a principal direction perpendicular to the surface of the substrate 104 and across the pixels 120, 122, 124, 126. Similarly, trenches 210T and protrusions 210P of image sensor 200 extend along a principal direction perpendicular to the surface of the substrate 104 and across the pixels 220, 222, 224, 226.

Figure 4:
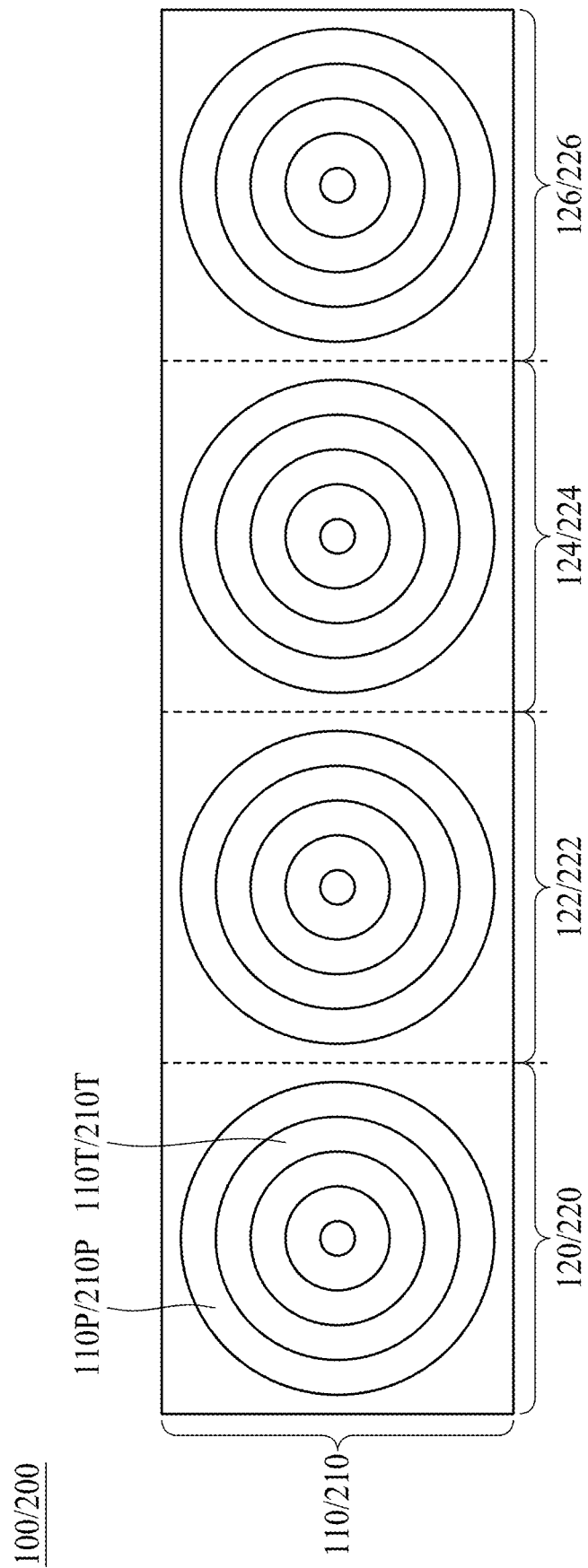
FIG. 4 is a top view of an image sensor with an array of pixels, according to some embodiments of the present disclosure.

Referring to FIG. 4, a top view of image sensors 100 and 200 with an array of pixels 120/220, 122/222, 124/224, 126/226, is provided according to some embodiments of present disclosure. As previously discussed in FIG. 1A, FIG. 1AA, and FIG. 2, the top view of the metasurface structures 110, 210 can be arranged in a circular fashion as shown in FIG. 4. The trenches 110T and protrusions 110P of image sensor 100 form elliptical or circular patterns with respect to a center of each pixels 120, 122, 124, 126. Similarly, trenches 210T and protrusions 210P of image sensor 200 form elliptical or circular patterns with respect to a center of each pixels 220, 222, 224, 226.

Figure 5:
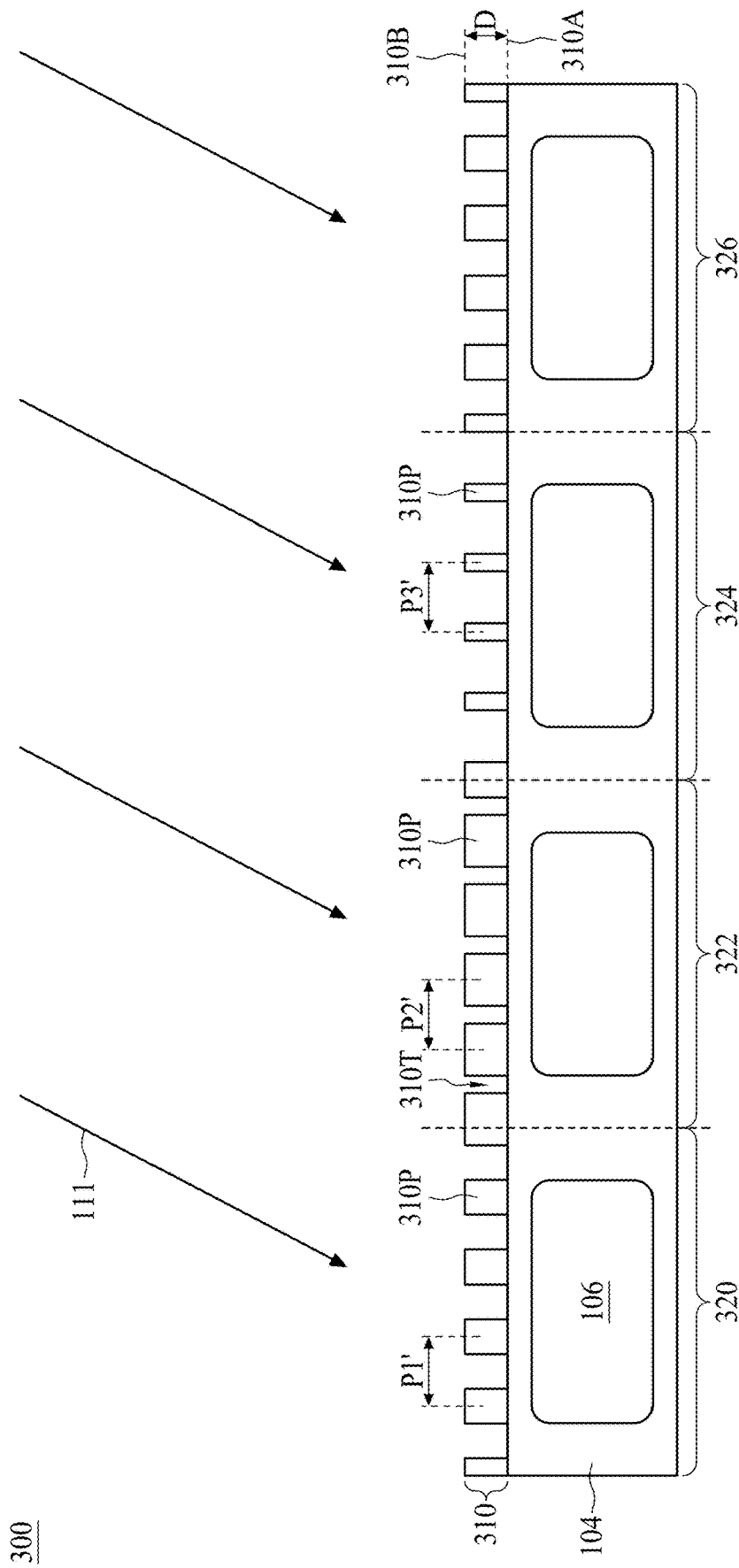
FIG. 5 is a cross-sectional view of an image sensor with an array of pixels, according to some embodiments of the present disclosure.

Referring to FIG. 5, a cross-sectional view of an image sensor 300 with an array of pixels 320, 322, 324, 326, is provided according to some embodiments of present disclosure. The image sensor 300 is substantially identical to image sensors 100 and 200 with additional variation on the pitch of the metasurface structure 310. As shown in FIG. 5, the pitch P1' of the protrusions 310P in the pixel 320 may be different from the pitch P2' of the protrusions 310P in the pixel 322, and the pitch P2' of the protrusions 310P in the pixel 322 may be different from the pitch P3' of the protrusions 310P in the pixel 324. Similarly, the pitch of the trenches 310T may be varied accordingly. In some embodiments, the periodicity in each of the pixels 320, 322, 324, 326 may be changed.

In some embodiments, the pitch P1', P2', P3' and/or a depth D of the metasurface structure 210 is smaller than a wavelength of the incident radiation 111, in order to avoid light diffraction. As a result, the metasurface structure 310 may include a nanostructure configured for light-matter interaction with the incident radiation 111. If the incident radiation 111 includes a range of wavelengths on the spectrum, the metasurface structure 310 may have a pitch P and/or a depth D smaller than the shortest wavelength of the range. The variation of pitches P1', P2', P3' of the protrusions 310P in different pixels provides different light filtering properties to corresponding pixels. For example, the pattern of the metasurface structure with the pitch P1' in the pixel 320 may promote, or greatly increase, the light field intensity of a first wavelength, while the pattern with the pitch P2' in the pixel 322 may promote, or greatly increase, the light field intensity of a first wavelength different from the first wavelength. Similarly, the pattern with the pitch P3' in the pixel 324 may promote, or greatly increase, the light field intensity of a third wavelength different from the first and the second wavelength. In some embodiments, the first, the second, and the third wavelength can be selected from red, blue, or green light.

To provide different light filtering property in different pixels by the metasurface structure 310, in addition to the pitch variation as shown in FIG. 5, an aspect ratio (i.e., a ratio of a height over a width) of the protrusions 310P or the trench 310T may be designed to be different in different pixels 320, 322, 324, 326.

Figure 6A:
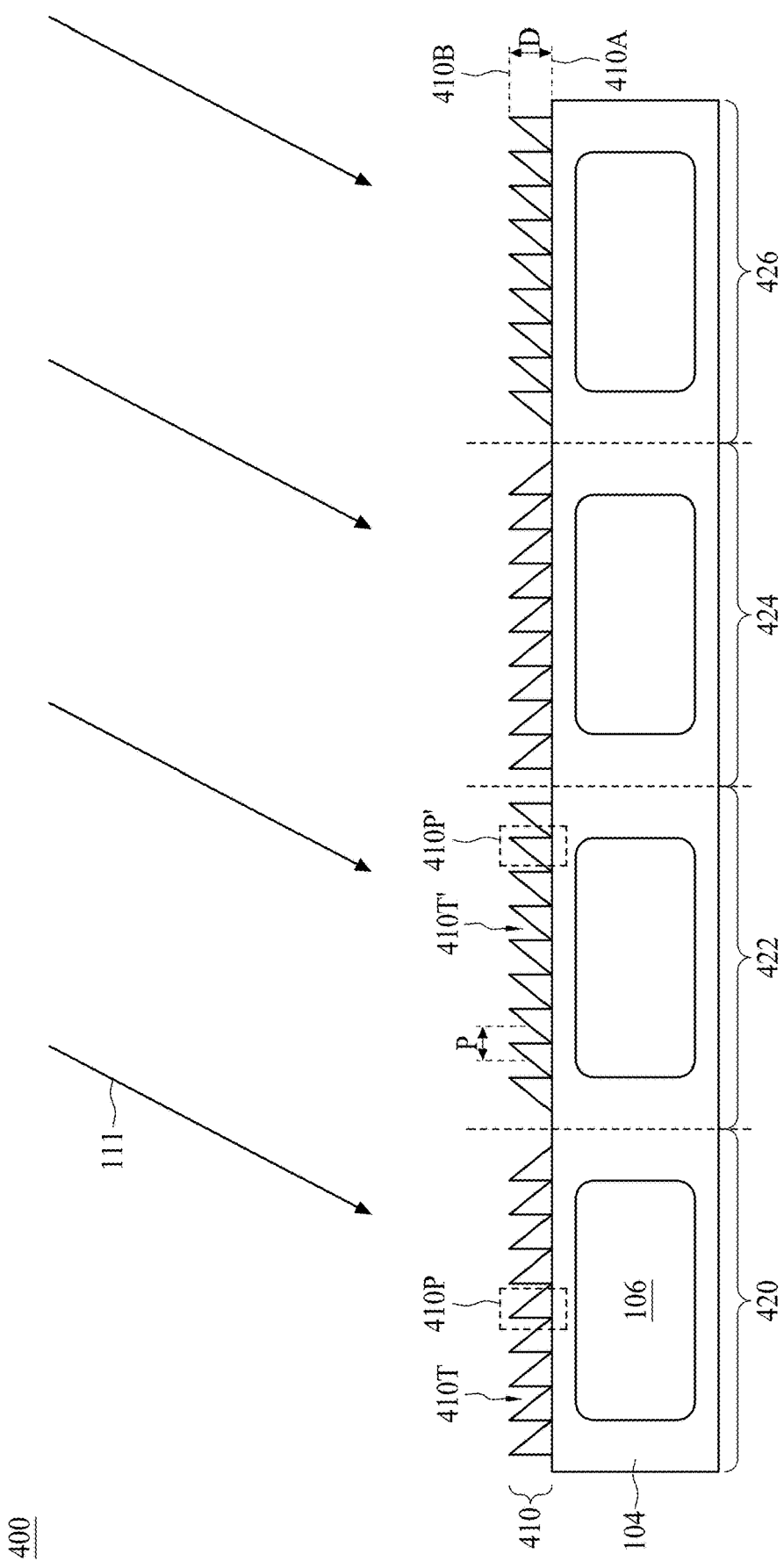
FIG. 6A is a cross-sectional view of an image sensor with an array of pixels, according to some embodiments of the present disclosure.

Referring to FIG. 6A, a cross-sectional view of some embodiments of an image sensor 400 with an array of pixels 420, 422, 424, 426, is provided according to some embodiments of present disclosure. The metasurface structure 410 includes a first side 410A and a second side 410B opposite to the first side 410A. For example, the first side 410A may be facing, or in contact with, the semiconductor substrate 104. The second side 410B may be facing the incident direction of the radiation 111. In some embodiments, the metasurface structure 410 includes a periodic pattern having alternating protrusions 410P and trenches 410T on the substrate 104 from a cross-sectional perspective. As shown in FIG. 6A, the trenches 410T have a triangular shape from a cross-sectional perspective and a linear arrangement (see FIG. 3) or a circular arrangement (see FIG. 4) from a top perspective. Two adjacent trenches 410T define a pitch P of the metasurface structure 410. A depth D between a top and a bottom of the trench 410T can be measured.

In some embodiments, the pitch P and/or a depth D of the metasurface structure 410 is smaller than a wavelength of the incident radiation 111, in order to avoid light diffraction. As a result, the metasurface structure 410 may include a nanostructure configured for light-matter interaction with the incident radiation 111. If the incident radiation 111 includes a range of wavelengths on the spectrum, the metasurface structure 410 may have a pitch P and/or a depth D smaller than the shortest wavelength of the range.

In some embodiments, the metasurface structure 410 may be a portion of the semiconductor substrate 104 formed by photolithography operations. In such embodiment, the metasurface structure 410 may be composed of materials identical to that of the substrate 104. Alternatively, the metasurface structure 410 may be formed on a top surface of the semiconductor substrate 104 by a spin-on coating operation followed by a patterning operation, for example, nanoimprint operation. In such embodiment, the metasurface structure 410 may be composed of polymeric materials having desired refractive indices. Alternatively, the metasurface structure 410 may be formed on a top surface of the semiconductor substrate 104 by a dielectric deposition operation or an annealing operation, followed by a patterning operation. In such embodiment, the metasurface structure 410 may be composed of oxides or nitrides materials having desired refractive indices. As shown in FIG. 6A, the pitch P of the metasurface structure 410 can be identical in all pixels 420, 422, 424, 426. However, the hypotenuse of each triangular protrusions 410P in the pixel 420 may be different from the hypotenuse of each triangular protrusions 410P' in the pixel 422, and therefore, the hypotenuse of each triangular trench 410T in the pixel 420 may be different from the hypotenuse of each triangular trench 410T' in the pixel 422. The hypotenuse of the triangular protrusions 410P in the pixel 420 is facing rightward while the hypotenuse of each triangular protrusions 410P' in the pixel 422 is facing leftward. In other words, the metasurface structure pattern in the pixel 420 may be a mirror image of the metasurface structure pattern in the pixel 422. In some embodiments, the pixel 422 is immediately adjacent to the pixel 420, and the metasurface structure patterns having a mirror symmetry with respect to a boundary between the pixels 420, 422 can be considered as a pixel pair generating two individual signals containing directional information of the incident radiation 111. As demonstrated in FIG. 6A, pixel 420 and pixel 422 form a first pixel pair while pixel 424 and pixel 426 form a second pixel pair.

Figure 6C:
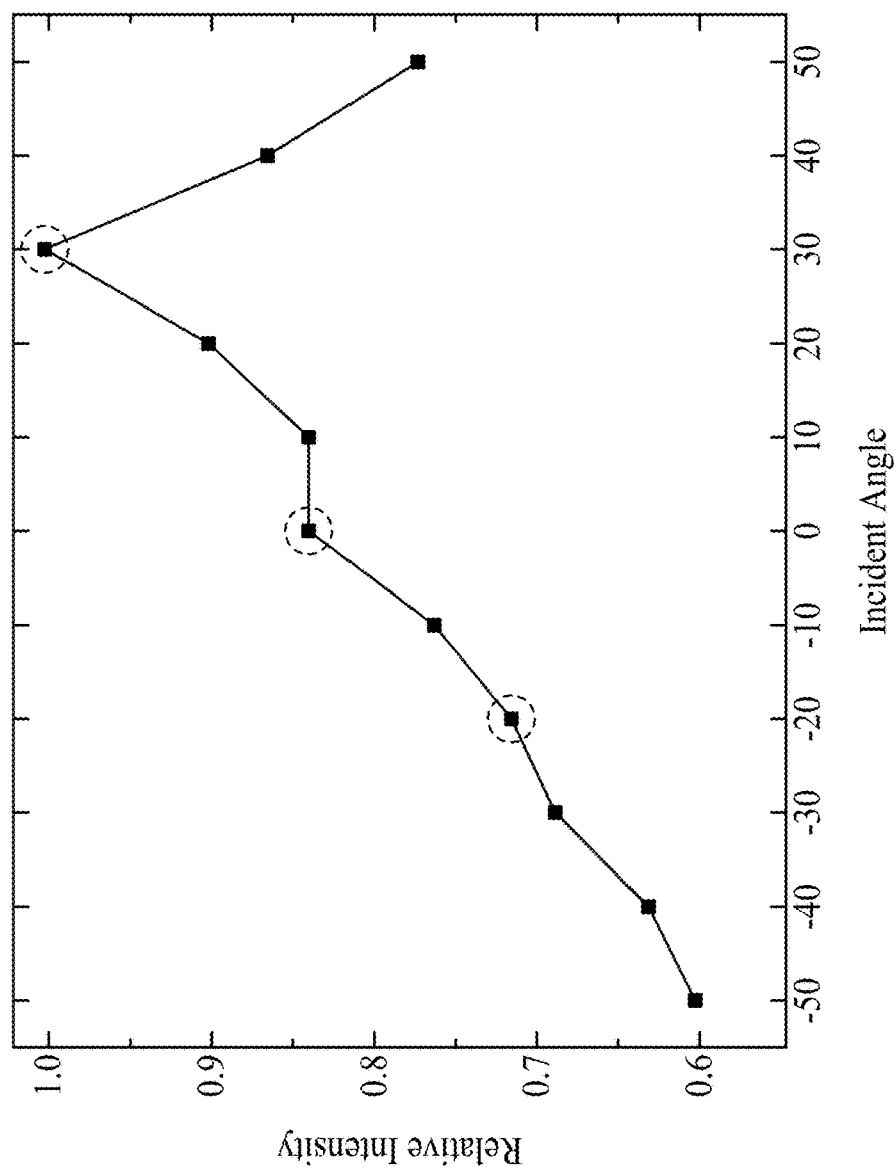
FIG. 6C is a simulation result of relative light field intensity with respect to incident angle, according to the structure of FIG. 6B.
Figure 6B:
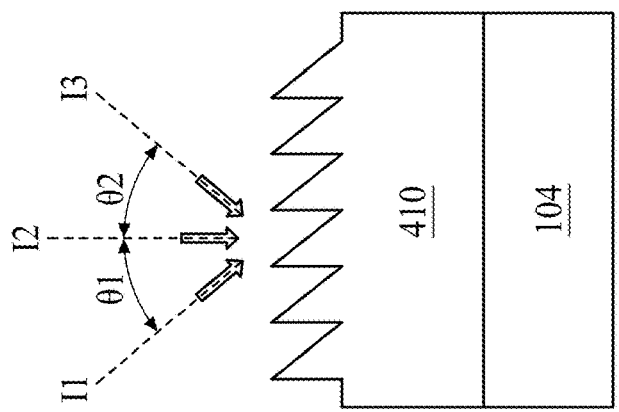
FIG. 6B is a metasurface structure over a semiconductor substrate, according to some embodiments of the present disclosure.

In some embodiments, the protrusions 410P and trenches 410T of the metasurface structure 410 have an asymmetric triangular shape from a cross-sectional perspective. The asymmetric triangular shape is defined with respect to the response to incident light of various incident angle, as shown in FIG. 6B to FIG. 6E. Incident radiation may impinge to the metasurface structure 410 from at least direction I1, direction I2, and direction I3, as illustrated in FIG. 6B. When direction I2 being perpendicular to the surface of the semiconductor substrate 14 is defined as 0 degree, direction I1 may be defined to possess a negative angel θ1 and direction I2 a positive angle θ2 with respect to direction I2. Referring to FIG. 6C, relative light field intensity with respect to incident angle is illustrated according to simulation results of the structure shown in FIG. 6B. As shown in FIG. 6C, given the asymmetric triangular shape of the metasurface structure 110, incident radiation with a negative incident angle shows a relative lower light field intensity compared to that generated by incident radiation with a positive incident angle (at least up to positive 30 degrees). Any geometric shape that lead to the differential light field intensities as shown in FIG. 6C can be considered as an asymmetric shape suitable for metasurface structure 410 construction. For example, the asymmetric pattern of the metasurface structure 110 may include asymmetric semiconductor-spherical shape, asymmetric tetragonal shape, and the like.

Figures 6D, 6E, 6F:
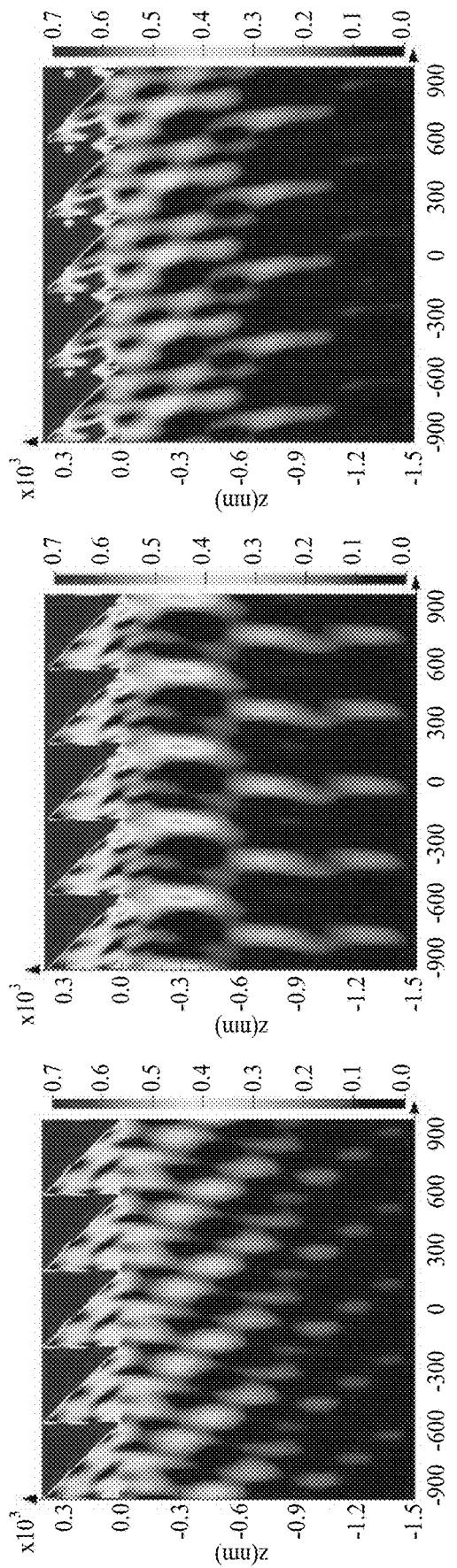
FIG. 6D, FIG. 6E, and FIG. 6F show light field intensity distribution in the structure of FIG. 6B when incident angles being −20 degrees, 0 degrees, and 30 degrees.

FIG. 6D, FIG. 6E, and FIG. 6F show light field intensity distribution in the structure of FIG. 6B when incident angles being −20 degrees, 0 degrees, and 30 degrees, respectively. The intensity of the light field is gray scale coded and normalized from 0.0 to 0.7 (see gray scale bar on the right of FIG. 6D, FIG. 6E, and FIG. 6F). As can be observed in FIG. 6D, FIG. 6E, and FIG. 6F, the highest light field intensity appears in the structure when incident angle being 30 degrees whereas the lowest light field intensity appears in the structure when incident angle being −20 degrees.

Figure 6G:
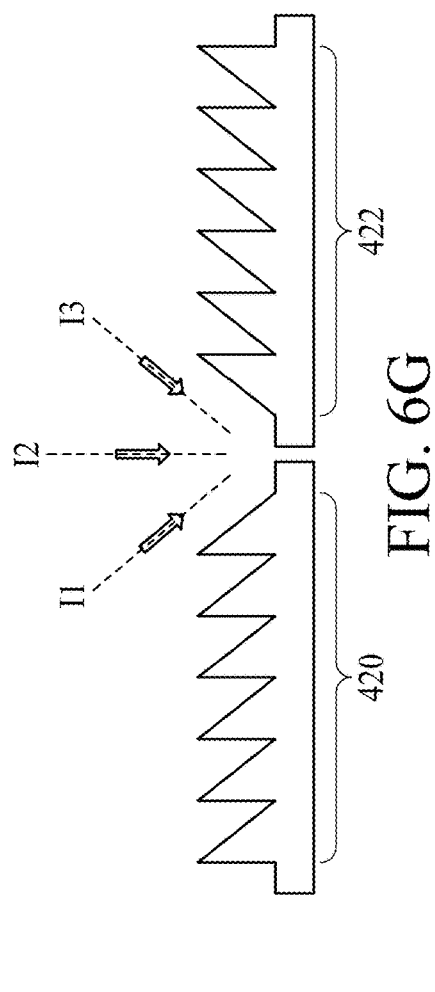
FIG. 6G shows a metasurface structure of a pixel pair, according to some embodiments of the present disclosure.
Figure 6H:
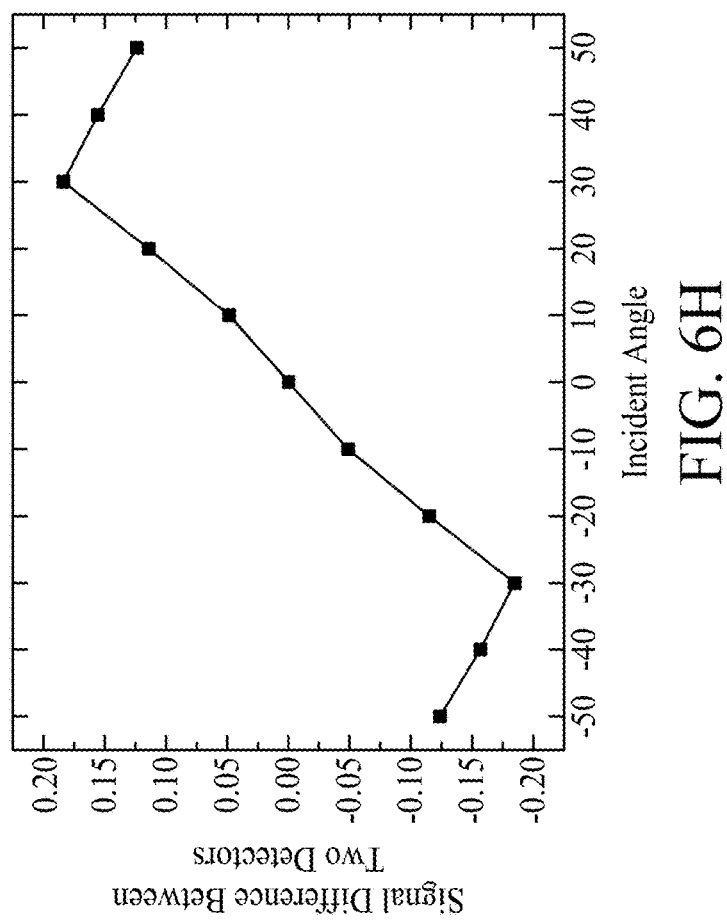
FIG. 6H shows a signal difference between each pixels in the pixel pair of FIG. 6G, with respect to different radiation incident angles.

FIG. 6G illustrate the metasurface structure 410 of a pixel pair (e.g., pixel 420 and pixel 422) in FIG. 6A. Each pixel of the pixel pair generate individual signal sending to a digital signal processing (DSP) circuit. Prior to sending the signals into the DSP circuit, a signal difference between pixel 420 and pixel 422 can be measured and illustrated as in FIG. 6H. The signal difference between pixel 420 and pixel 422 when the incident radiation impinging from direction I1, or from a negative angle, may be a negative value or may be greater in absolute value than the signal difference between pixel 420 and pixel 422 when the incident radiation impinging from direction I2, or from 0 degree. Similarly, the signal difference between pixel 420 and pixel 422 when the incident radiation impinging from direction I3, or from a positive angle, may be a positive value or may be greater in absolute value than the signal difference between pixel 420 and pixel 422 when the incident radiation impinging from direction I2, or from 0 degree. Based on the signal difference information in the pixel pair, the directional information of the incident radiation can be detected by the image sensor.

Figure 7:
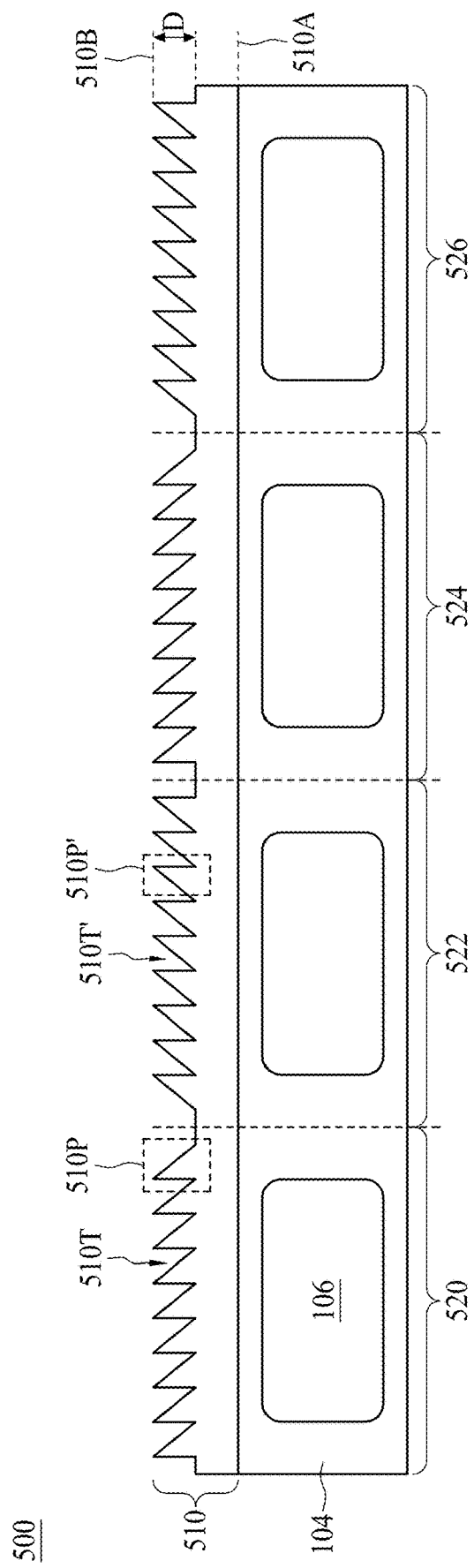
FIG. 7 is a cross-sectional view of an image sensor with an array of pixels, according to some embodiments of the present disclosure.

Referring to FIG. 7, a cross-sectional view of some embodiments of an image sensor 500 with an array of pixels 520, 522, 524, 526, is provided according to some embodiments of present disclosure. Image sensor 500 in FIG. 7 is different from the image sensor 400 in FIG. 6A in that the trench depth D of the metasurface structure 510 is less than the entire thickness of the metasurface structure 510, that is, a distance between the first side 510A and the second side 510B. As shown in FIG. 7, the trenches 510T has a triangular shape from a cross-sectional perspective and a linear arrangement (see FIG. 3) or a circular arrangement (see FIG. 4) from a top perspective. In some embodiments, the metasurface structure pattern in the pixel 520 may be a mirror image of the metasurface structure pattern in the pixel 522, as previously discussed in FIG. 6A.

Figure 8:
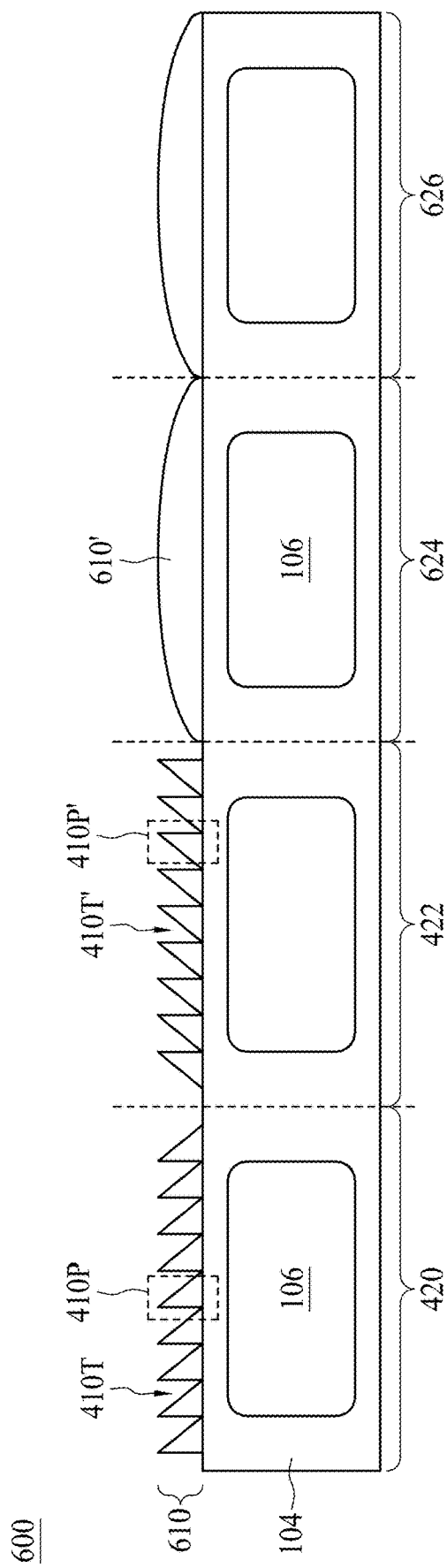
FIG. 8 is a cross-sectional view of an image sensor with an array of pixels, according to some embodiments of the present disclosure.
Figure 9:
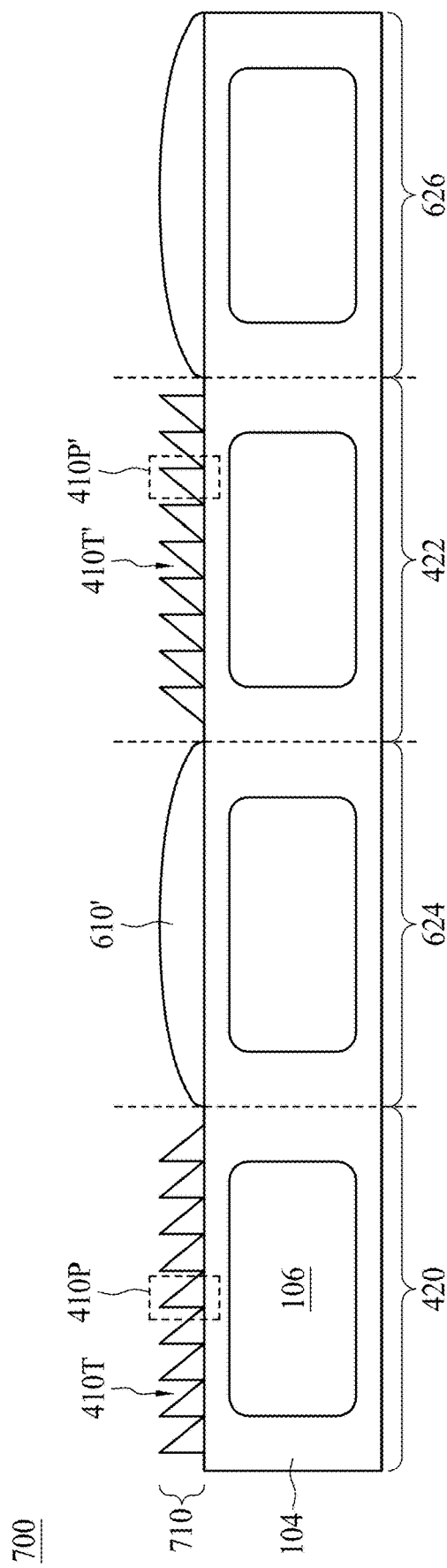
FIG. 9 is a cross-sectional view of an image sensor with an array of pixels, according to some embodiments of the present disclosure.

Referring to FIG. 8, a cross-sectional view of some embodiments of an image sensor 600 with an array of pixels 420, 422, 624, 626, is provided according to some embodiments of present disclosure. Description of the pixels 420, 422 and the metasurface structure 610 can be referred to those previously addressed in FIG. 6A and are not repeated here for brevity. Image sensor 600 may further include a pixel 624 having a photodiode region 106 in the substrate 104 and a plano-convex structure 610' over the corresponding photodiode region 106. In some embodiments, the plano-convex structure is a microlens configured to focus incident radiation towards the photodiode region 106. Differences between the plano-convex structure 610' lie in that the microlens over pixel 624 may be an image capture lens without obtaining directional information from incident radiation. In some embodiments, the plano-convex structure 610 possesses less optical power (i.e., a degree to which the structure converges or diverges light) than the metasurface structure 610 over pixels 420, 422. However, the plano-convex structure 610' may better collet incident radiation coming from all directions. As shown in FIG. 8, pixels 420, 422 with metasurface structure 610 are arranged immediately adjacent to each other as a pixel pair. Alternatively, as shown in FIG. 9, the plano-convex structure 610' may separate the aforesaid pixel pair 420, 422 by positioned therebetween, that is, the metasurface structure 710 with mirror symmetry (i.e., the metasurface structure 710 over pixel 420 and 422) may not have to be arranged immediately adjacent to each other in order to obtain sufficient signal difference for subsequent signal processing.

Figure 10:
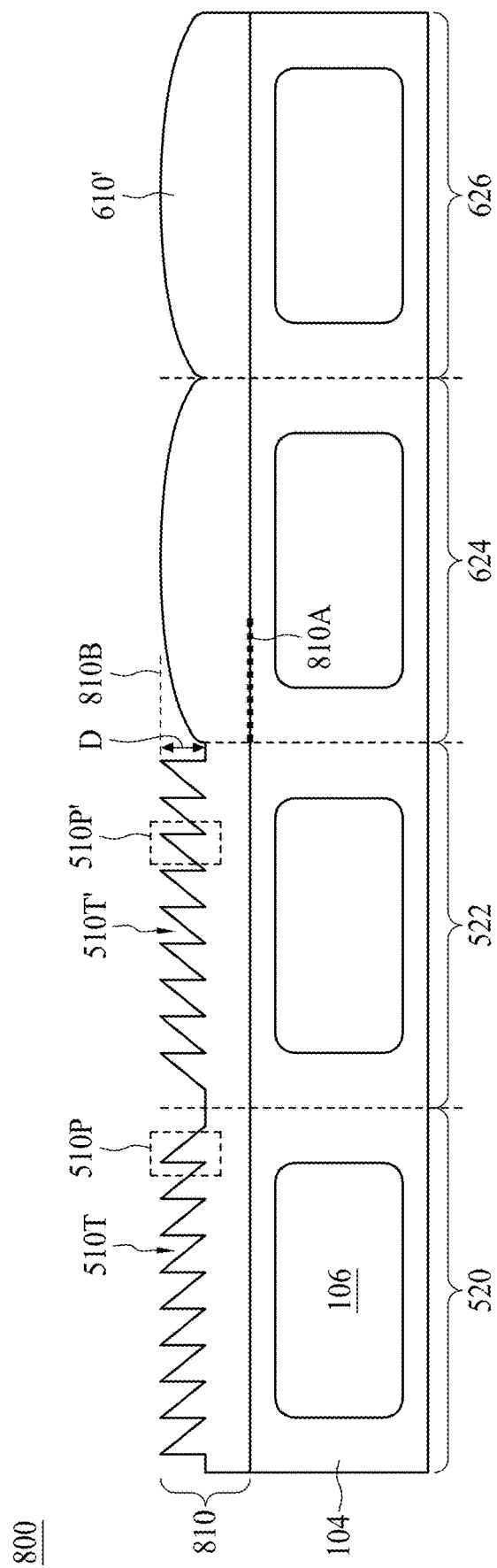
FIG. 10 is a cross-sectional view of an image sensor with an array of pixels, according to some embodiments of the present disclosure.

Referring to FIG. 10, a cross-sectional view of some embodiments of an image sensor 800 with an array of pixels 520, 522, 624, 626, is provided according to some embodiments of present disclosure. Image sensor 800 in FIG. 10 is different from the image sensor 600 in FIG. 8 in that the trench depth D of the metasurface structure 810 is less than the entire thickness of the metasurface structure 810, that is, a distance between the first side 810A and the second side 810B. As shown in FIG. 10, the trenches 510T has a triangular shape from a cross-sectional perspective and a linear arrangement (see FIG. 3) or a circular arrangement (see FIG. 4) from a top perspective. In some embodiments, the metasurface structure pattern in the pixel 520 may be a mirror image of the metasurface structure pattern in the pixel 522, as previously discussed in FIG. 8. Compared to FIG. 8, the plano-convex structure 610' over pixels 624, 626 in FIG. 10 may have thicknesses different from those shown in FIG. 8. Although in some embodiment, the thicknesses of the plano-convex structure 610' in FIG. 10 may keep the same as that in FIG. 8.

Figure 11:
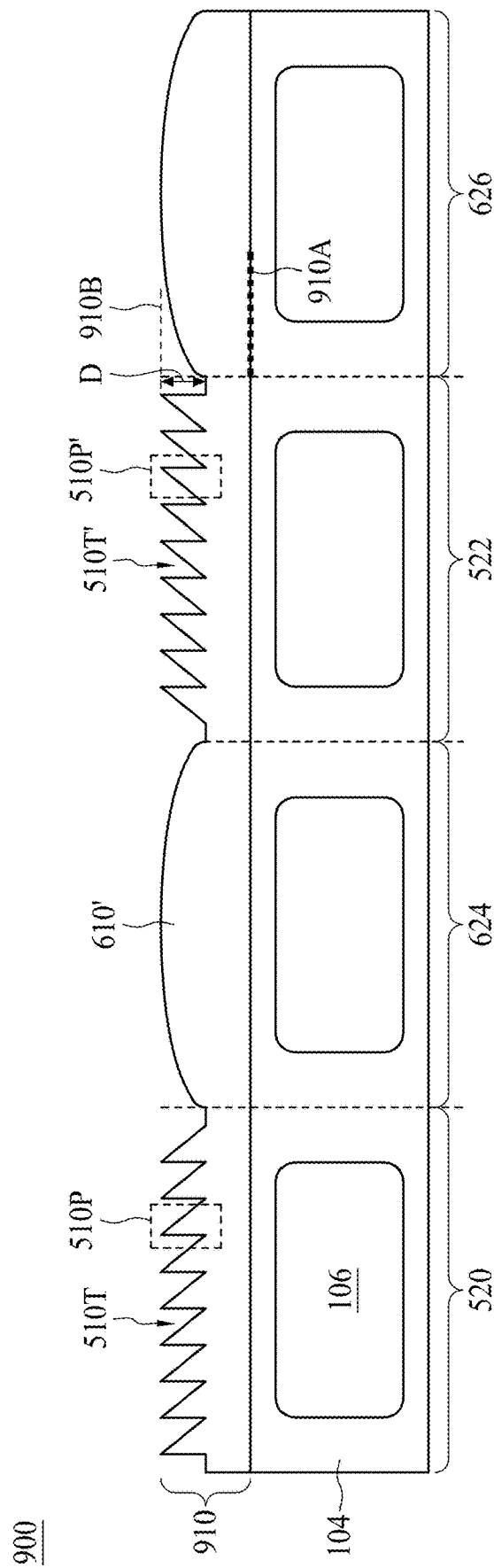
FIG. 11 is a cross-sectional view of an image sensor with an array of pixels, according to some embodiments of the present disclosure.

Referring to FIG. 11, a cross-sectional view of some embodiments of an image sensor 900 with an array of pixels 520, 624, 522, 626, is provided according to some embodiments of present disclosure. Image sensor 900 in FIG. 11 is different from the image sensor 700 in FIG. 9 in that the trench depth D of the metasurface structure 910 is less than the entire thickness of the metasurface structure 910, that is, a distance between the first side 910A and the second side 910B. As shown in FIG. 11, the trenches 510T has a triangular shape from a cross-sectional perspective and a linear arrangement (see FIG. 3) or a circular arrangement (see FIG. 4) from a top perspective. In some embodiments, the metasurface structure pattern in the pixel 520 may be a mirror image of the metasurface structure pattern in the pixel 522, as previously discussed in FIG. 9. As shown in FIG. 11, the plano-convex structure 610' may separate the pixel pair 520, 522 by positioned therebetween, that is, the metasurface structure 910 with mirror symmetry (i.e., the metasurface structure 910 over pixel 520 and 522) may not have to be arranged immediately adjacent to each other in order to obtain sufficient signal difference for subsequent signal processing.

In some embodiments, the present disclosure provides a pixel for receiving an incident light, the pixel including a semiconductor substrate, a photo diode in the semiconductor substrate, and a metasurface structure over the semiconductor substrate. The metasurface structure has a first side and a second side opposite to the first side, the first side of the metasurface structure facing the semiconductor substrate, the second side of the metasurface structure facing the incident light. The metasurface structure includes a plurality of trenches at the second side, wherein the plurality of trenches have a same profile from a cross-sectional view.

In some embodiments, the present disclosure provides an image sensor, including a first pixel having a first photo diode and a first metasurface structure over the first photo diode, a second pixel having a second photo diode and a second metasurface structure over the second photo diode. Each of the first metasurface structure and the second metasurface structure includes a plurality of trenches thereon, and each of the trenches of the first metasurface structure has a first cross-sectional profile, each of the trenches of the second metasurface structure has a second cross-sectional profile different from the first cross-sectional profile.

In some embodiments, the present disclosure provides an image sensor, including a first pixel having a first asymmetric surface pattern and a first light-detection region, configured to generate a first signal, and a second pixel having a second asymmetric surface pattern and a second light-detection region, configured to generate a second signal. The first asymmetric surface pattern is a mirror image of the second asymmetric surface pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel for receiving an incident light, comprising:
a semiconductor substrate;
a photo diode in the semiconductor substrate;
a metasurface structure over the semiconductor substrate, the metasurface structure having a first side and a second side opposite to the first side, the first side of the metasurface structure facing the semiconductor substrate, the second side of the metasurface structure facing the incident light, and the metasurface structure comprises a plurality of trenches at the second side, wherein the plurality of trenches have a same profile from a cross-sectional view, and the plurality of trenches comprises a periodic structure having a pitch smaller than a wavelength of the incident light;
wherein:
the plurality of trenches form patterns of concentric circles with respect to a center of the pixel from a top view; or
the pixel further includes a color filter between the metasurface structure and the semiconductor substrate.

2. The pixel of claim 1, wherein each of the plurality of trenches is a tetragonal shape from the cross-sectional view.

3. The pixel of claim 1, wherein a depth of each of the plurality of trenches is smaller than a wavelength of the incident light.

4. The pixel of claim 2, wherein the plurality of trenches comprises a linear arrangement from a top view.

5. The pixel of claim 1, wherein the metasurface structure comprises materials different from the semiconductor substrate.

6. The pixel of claim 5, wherein the metasurface structure comprises semiconductor oxides or polymeric materials.

7. The pixel of claim 1, wherein each of the plurality of trenches is a triangular shape from the cross-sectional view.

8. The pixel of claim 7, wherein the plurality of trenches comprises a linear arrangement from a top view.

9. An image sensor, comprising:
a first pixel, comprising a first photo diode and a first metasurface structure over the first photo diode; and
a second pixel, comprising a second photo diode and a second metasurface structure over the second photo diode;
wherein each of the first metasurface structure and the second metasurface structure comprises a plurality of trenches thereon, and
each of the trenches of the first metasurface structure has a first cross-sectional profile, and each of the trenches of the second metasurface structure has a second cross-sectional profile different from the first cross-sectional profile;
wherein:
the first cross-sectional profile and the second cross-sectional profile are triangular shapes with different hypotenuse direction; or
the image sensor further includes a third pixel including a third photo diode and a plano-convex structure over the third photo diode.

10. The image sensor of claim 9, wherein the first cross-sectional profile and the second cross-sectional profile are tetragonal shapes with different periodicities.

11. The image sensor of claim 9, wherein the first pixel is immediately adjacent to the second pixel.

12. The image sensor of claim 9, wherein the third pixel is between the first pixel and the second pixel.

13. An image sensor, comprising:
a first pixel having a first asymmetric surface pattern and a first light-detection region, configured to generate a first signal; and
a second pixel having a second asymmetric surface pattern and a second light-detection region, configured to generate a second signal,
wherein the first asymmetric surface pattern is a mirror image of the second asymmetric surface pattern.

14. The image sensor of claim 13, wherein the first asymmetric surface pattern comprises a periodic feature with a characteristic dimension smaller than a wavelength of an incident light.

15. The image sensor of claim 13, further comprising a third pixel having a symmetric surface pattern and a third light-detection region, configured to generate a third signal.

* * * * *